United States Patent [19]
Mermelstein

[11] Patent Number: 6,140,660
[45] Date of Patent: Oct. 31, 2000

[54] OPTICAL SYNTHETIC APERTURE ARRAY

[75] Inventor: Michael Mermelstein, Cambridge, Mass.

[73] Assignee: Massachusetts Institute of Technology, Cambridge, Mass.

[21] Appl. No.: 09/274,601

[22] Filed: Mar. 23, 1999

[51] Int. Cl.[7] .............................. G02B 27/42; G02B 5/32; G03B 27/42; G01B 11/02; G03H 1/10
[52] U.S. Cl. ........................... 250/550; 355/53; 356/351; 359/9; 359/11; 359/15
[58] Field of Search ................................ 250/216, 237 R, 250/550; 356/345, 347, 351; 355/53, 125, 126; 359/9, 10, 11, 29, 577, 578, 15

[56] References Cited

U.S. PATENT DOCUMENTS

| Re. 35,930 | 10/1998 | Brueck et al. | 430/311 |
|---|---|---|---|
| 5,142,386 | 8/1992 | Anderson et al. | 369/10 |
| 5,384,573 | 1/1995 | Turpin | 342/179 |
| 5,415,835 | 5/1995 | Brueck et al. | 430/396 |
| 5,705,321 | 1/1998 | Brueck et al. | 430/316 |
| 5,759,744 | 6/1998 | Brueck et al. | 430/312 |
| 5,771,098 | 6/1998 | Ghosh et al. | 356/363 |

FOREIGN PATENT DOCUMENTS

| 2142427A | 1/1985 | United Kingdom | G01B 11/30 |
|---|---|---|---|
| WO 97/48021 | 12/1997 | WIPO | G03F 7/20 |

OTHER PUBLICATIONS

Anderson, et al. "Holographic lithography with thick photoresist," *Appl. Phys. Lett.*, vol. 43, No. 9, Nov. 1, 1983, pp. 874–876.

Brueck, S. "Imaging interferometric lithography," *Microlithography World*, Winter 1998, pp. 2–7.

Brueck, et al. "Interferometric lithography—from periodic arrays to arbitrary patterns," *Microeletronic Engineering*, 41/42 (1998), pp. 145–148.

Chen et al. "Interferometric lithography of sub–micrometer sparse hole arrays for field–emission display applications," *Journal of Vacuum Science & Technology B*, Second Series, vol. 14, No. 5, Sep./Oct. 1996, pp. 338–3349.

Chen et al. "Process development for 180–nm structures using interferometric lithography and I–line photoresist," *SPIE–The International Society for Optical Engineering*, vol. 3048, Mar. 10–11, 1997, pp. 309–318.

(List continued on next page.)

*Primary Examiner*—Georgia Epps
*Assistant Examiner*—David N. Spector
*Attorney, Agent, or Firm*—Testa, Hurwitz & Thibeault

[57] ABSTRACT

A synthetic aperture system for producing a non-periodic pattern in a region of overlap. The system includes a source of electromagnetic radiation producing a plurality of electromagnetic beams, a plurality of beam controllers positioned to receive a respective one of the plurality of electromagnetic beams and direct the respective electromagnetic beam into the region of overlap; and a system controller in electrical communication with each of the plurality of the beam controllers. Each beam controller controls at least one of the phase, amplitude and polarization of a respective one of the plurality of electromagnetic beams in response to control signals from the system controller. The result is a non-periodic pattern formed within the region of overlap by the interference of a plurality of electromagnetic beams in response to the control signals from the system controller.

The invention also relates to a method for producing a non-periodic pattern in a region of overlap. The method includes the steps of providing a plurality of electromagnetic beams, directing the plurality of electromagnetic beams into the region of overlap, and modulating at least one of the phase, amplitude and polarization of at least one of the plurality of electromagnetic beams to thereby form a predetermined non-periodic pattern in the region of overlap by the interference of the plurality of electromagnetic beams.

22 Claims, 5 Drawing Sheets

OTHER PUBLICATIONS

Farhoud et al. "Fabrication of Large Area Nanostructured Magnets by Interferometric Lithography," *IEEE Transactions of Magnetics*, vol. 34., No. 4, Pt. 1, Jul. 1998, pp. 1087–1089.

Ferrera et al. "Analysis of distortion in interferometric lithography," *Journal of Vacuum Science & Technology B*, Second Series, vol. 14, No. 6, Nov./Dec. 1996, pp. 4009–4013.

Naqvi et al. "Diffractive techniques for lithographic process monitoring and control," *Journal of Vacuum Science & Technology B*, Second Series, vol. 12, No. 6, Nov./Dec. 1994, pp. 3600–3607.

Savas et al. "Large–area achromatic interferometric lithography for 100 nm period gratings and grids," *Journal of Vacuum Science & Technology B*, Second Series, vol. 14, No. 6, Nov./Dec. 1996, pp. 4167–4170.

Savas et al. Achromatic interferometric lithography for 100–nm–period gratings and grids, *Journal of Vacuum Science & Technology B*, Second Series, vol. 13, No. 6. Nov./Dec. 1995, pp. 2732–2735.

Schattenburg et al. "Fabrication of high energy x–ray transmission gratings for AXAF," *SPIE–The International Society for Optical Engineering*, vol. 2280, pp. 181–190.

Schattenburg et al. "Optically matched trilevel resist process for nanostructure fabrication," *Journal of Vacuum Science & Technology B*, Second Series, vol. 13, No. 6, Nov./Dec. 1995, pp. 3007–3011.

Spallas et al. "Field emitter array mask patterning using laser interference lithography," *Journal of Vacuum Science & Technology B*, Second Series, vol. 13, No. 6, Sep./Oct. 1995, pp. 1973–1978.

Zaidi et al. "Interferometric lithography exposure tool for 180–nm structures," *SPIE–The International Society for Optical Engineering*, vol. 3048, Mar. 10–11, 1997, pp. 248–254.

Zaidi et al. "Multiple–exposure interferometric lithography," *Journal of Vacuum Science & Technology B*, Second Series, vol. 11, No. 3, May/Jun. 1993, pp. 658–666.

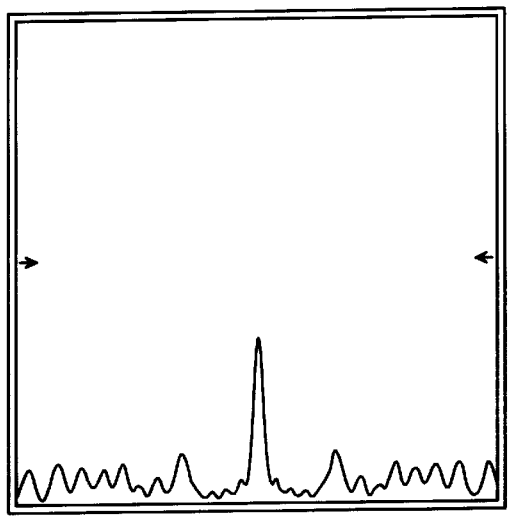
FIG. 2a
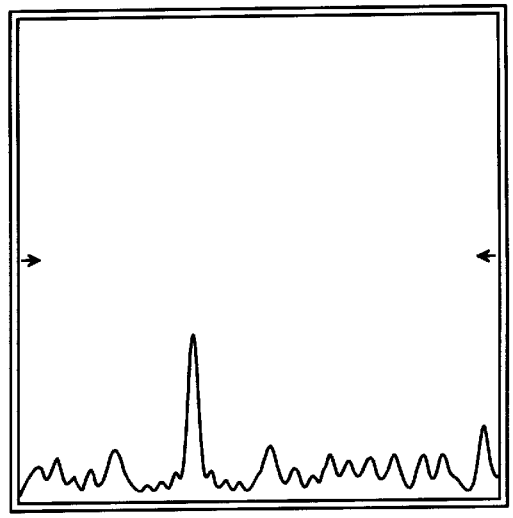
FIG. 2b
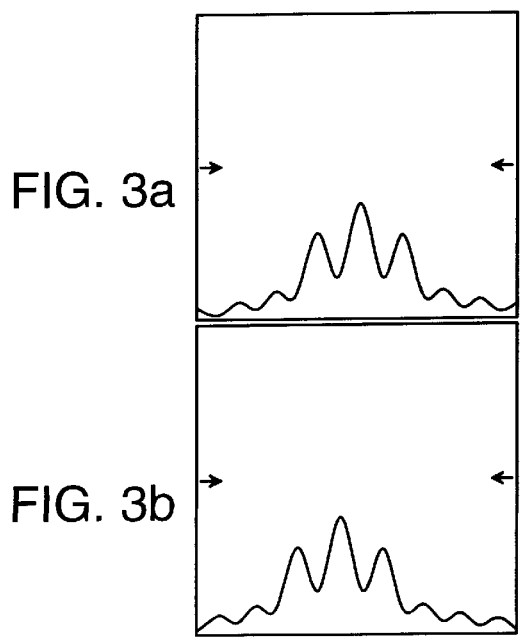
FIG. 3a
FIG. 3b
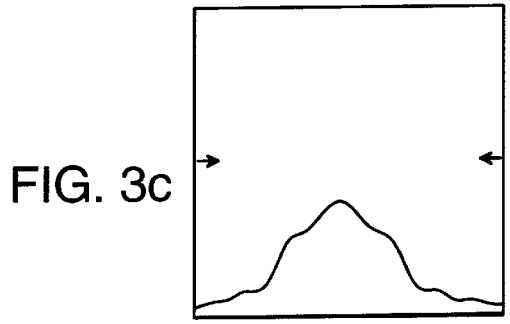
FIG. 3c

| AMPLITUDES | PHASES |
|---|---|
| 3757 | 3.278 |
| 2722 | 2.371 |
| 520 | 1.181 |
| 420 | 2.550 |
| 1324 | 4.440 |
| 2769 | 3.315 |
| 3006 | 2.779 |
| 3014 | 2.767 |
| 2758 | 3.380 |
| 1308 | 4.494 |
| 416 | 2.882 |
| 536 | 1.051 |
| 2726 | 2.407 |
| 3749 | 3.293 |
| 3706 | 3.627 |
FIG. 6b
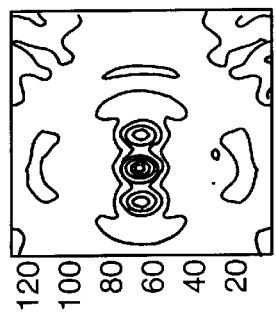
FIG. 5b
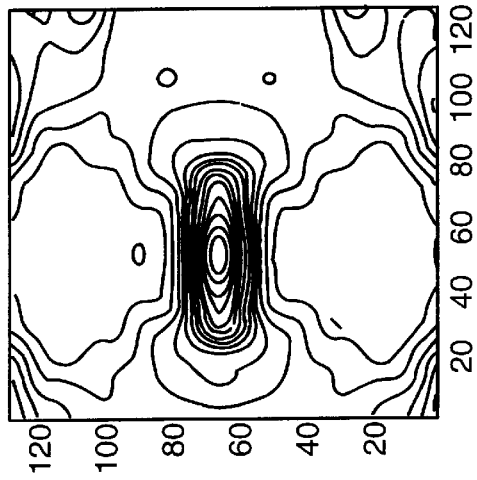
FIG. 5c
| AMPLITUDES | PHASES |
|---|---|
| 3757 | 1.634 |
| 2722 | 1.167 |
| 520 | 0.625 |
| 420 | 2.738 |
| 1324 | 5.340 |
| 2769 | 4.771 |
| 3006 | 4.539 |
| 3014 | 4.528 |
| 2758 | 4.836 |
| 1308 | 5.394 |
| 416 | 3.071 |
| 536 | 0.494 |
| 2726 | 1.202 |
| 3749 | 1.649 |
| 3706 | 1.827 |
FIG. 6a
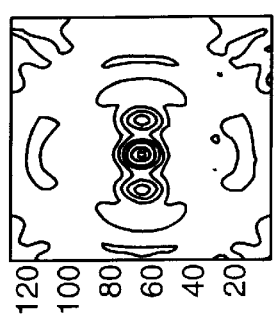
FIG. 5a

OPTICAL SYNTHETIC APERTURE ARRAY

STATEMENT REGARDING FEDERALLY SPONSORED RESEARCH

This invention was made with government support under Contract No. F30602-97-2-0106 awarded by the Defense Advanced Research Projects Agency (DARPA). The government may have certain rights in the invention.

FIELD OF THE INVENTION

The invention relates to the field of synthetic aperture arrays and more specifically to the field of optical synthetic aperture arrays.

BACKGROUND OF THE INVENTION

High resolution projection systems are used to project an image of a mask onto the surface of a semiconductor wafer coated with a chemical photoresist during the fabrication of semiconductor circuits. Exposed regions of photoresist within the image of the mask are chemically altered and react differently to subsequent chemical or physical treatment of the wafer than unexposed regions. A series of masks and intervening treatments are used to form layers on the wafer having the required electronic structures.

The masks used in the process are expensive and time consuming to produce. Further changes required in the circuitry after the mask is produced typically require a new mask to be created. The complex optical systems used in the process are also expensive and require significant maintenance. High numerical aperture lenses have small depths of field and are limited in contrast at higher spatial frequencies. The demanding requirements of the semiconductor industry for higher resolution, contrast, depth of field and optical efficiency are coupled with a desire to minimize distortion. Physical constraints inherent in projection lens systems will limit further performance improvements.

The present invention overcomes the problems associated with the use of physical masks and lenses.

SUMMARY OF THE INVENTION

The invention relates to a synthetic aperture system for producing a non-periodic pattern in a region of overlap. The system includes a source of electromagnetic radiation producing a plurality of electromagnetic beams, a plurality of beam controllers positioned to receive a respective one of the plurality of electromagnetic beams and direct the respective electromagnetic beam into the region of overlap and a system controller in electrical communication with each of the plurality of the beam controllers. Each beam controller controls at least one of the phase, amplitude and polarization of a respective one of the plurality of electromagnetic beams in response to control signals from the system controller. The result is a non-periodic pattern formed within the region of overlap by the interference of a plurality of electromagnetic beams in response to the control signals from the system controller.

In one embodiment the plurality of sources of electromagnetic radiation includes a laser producing an electromagnetic beam and a beam splitter device positioned to receive the electromagnetic beam and produce a plurality of electromagnetic sources therefrom. In one embodiment one of the beam controllers includes an acousto-optic modulator.

In another embodiment the system includes a field stop adjacent to the image plane. The field stop limits a spatial extent of the non-periodic pattern. In still yet another embodiment the system further includes an apodizing element for at least one of the plurality of electromagnetic beams. The apodizing element limits a spatial extent of the at least one electromagnetic beam.

The invention also relates to a method for producing a non-periodic pattern in a region of overlap. The method includes the steps of providing a plurality of electromagnetic beams, directing the plurality of electromagnetic beams into the region of overlap, and modulating at least one of the phase, amplitude and polarization of at least one of the plurality of electromagnetic beams to thereby form a predetermined non-periodic pattern on the image plane by the interference of the plurality of electromagnetic beams.

In one embodiment the step of modulating at least one of the phase, amplitude and polarization of each of the plurality of electromagnetic beams includes the steps of providing an acoustic-optic modulator and acoustic-optically modulating the electromagnetic beam. In another embodiment the step of providing the plurality of electromagnetic beams includes the steps of providing a source of an electromagnetic beam and splitting the electromagnetic beam into a plurality of electromagnetic beams.

In another embodiment the method further includes the steps of providing a substrate, providing a layer of photoresist on the substrate, and exposing the photoresist to the non-periodic pattern. In yet another embodiment the method further includes repeating the step of modulating to generate a predetermined pattern in the layer of photoresist. In still another embodiment the method further includes the step of calibrating the interference pattern prior to forming the non-periodic pattern. In one embodiment the step of calibrating the interference occurs during the generation of the non-periodic pattern. In still yet another embodiment the method includes the step of apodizing the non-periodic pattern.

The invention also relates to a system and a method that can be used to replace the lens, the mask and the mask illuminator of conventional lithography systems with a discrete set of controllable beam sources. Highly reliable solid-state modulators can be used to control the amplitudes and phases of the beams. The system and method are scaleable to wavelength regimes for which high numerical aperture lenses are not feasible. Further advantages include the optimum use of beam energy, excellent control of contrast and a large depth of field.

BRIEF DESCRIPTION OF THE DRAWINGS

The foregoing and other objects, features and advantages of the invention will become apparent from the following more particular description of preferred embodiments of the invention, as illustrated in the accompanying drawings, in which:

FIGS. 2a and b are simulated intensity profiles depicting the effect of changing parameters in a fifteen beam optical synthetic aperture array system;

FIGS. 3a–c is a simulation of an intensity profile resulting from the combination of two projection primitives (FIGS. 3a and b) to obtain a desired projection image (FIG. 3c);

FIGS. 5a–c is a contour intensity plot resulting from the combination of two projection primitives (FIGS. 5a and b) to obtain a desired projection image (FIG. 5c);

FIGS. 6a and b are tables of the amplitude and phase for each of the fifteen beams which were used to create the projection primitives shown in FIGS. 5a and b, respectively;

DESCRIPTION OF THE PREFERRED EMBODIMENT

Figure 1:
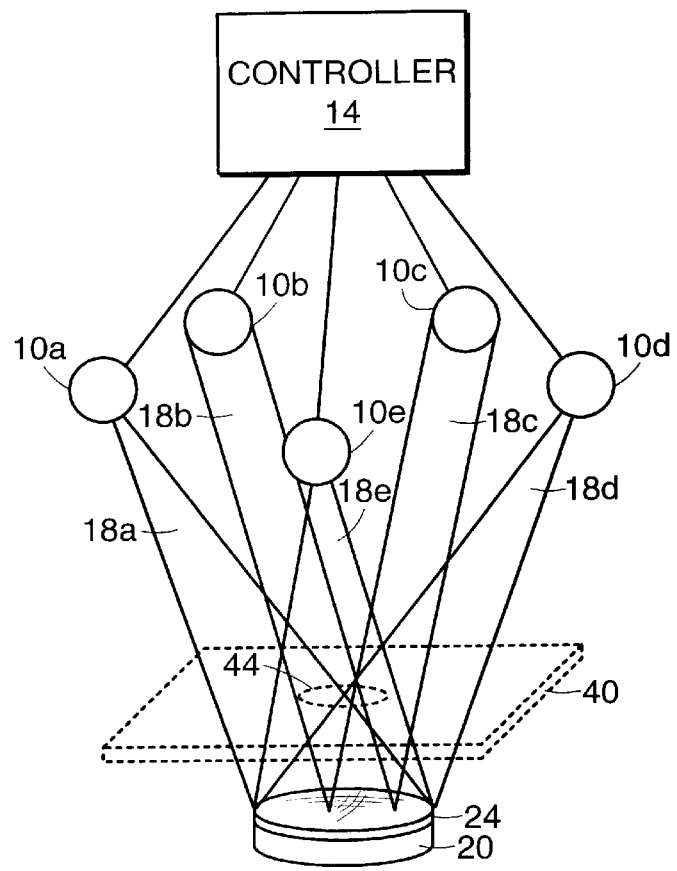
FIG. 1 is a highly schematic diagram of an embodiment of a system constructed in accordance with the invention.

Referring to FIG. 1 an optical synthetic aperture array system includes a number of optical radiation sources 10 (a–e), each of which is controlled by a controller 14 to produce an optical beam 18 (a–e) having a predetermined intensity, phase and polarization. The beams 18 (a–e) are directed toward the surface of a wafer 20 such that the beams 18 (a–e) overlap and form an interference pattern at the surface of the wafer 20. The width of the beams 18 or of an aperture or apodizing element (not shown) above the wafer 20 limits the region of overlap to a size appropriate to the number of beams used to form the pattern.

Referring to FIG. 2a, an intensity profile of an interference pattern simulated as being formed from fifteen beams is depicted. The peak of the radiation intensity is roughly at the center of the graph. By changing the relative phase and intensities of the fifteen beams, a new pattern is formed FIG. 2b in which the peak radiation pattern is shifted to the left. Thus by adjustment of the relative phase and intensity of the beams from a number of sources an arbitrary pattern may be generated. Although only five radiation sources, generally 10, are shown for clarity any number of sources can be used. In one embodiment fifteen sources 10 are used.

The wafer 20 is coated with a positive photoresist 24 which reacts upon exposure to optical radiation to form a material which is removed in subsequent wafer treatment as is practiced using conventional lithography known to the art. Alternatively, the wafer 20 is coated with a negative photoresist 24 which reacts upon exposure to optical radiation to form a material which resists subsequent wafer treatment. Once the wafer 20 has been exposed to the beam radiation for a period of time, the intensity and phase of the radiation beams, generally 18, is changed by the controller 14, and the resist coated wafer 20 is exposed again to the new interference pattern which is thereby formed. In this way the desired exposure pattern may be constructed from multiple exposures of the wafer 20 to a number of basic or primitive interference patterns.

FIGS. 3a and 3b depict the intensity profiles of two projection primitives which are combined through multiple exposures to form a desired pattern (FIG. 3c) on the chemical resist 24. In this case the formed pattern is a rectangle having a 3:10 aspect ratio. In this example the two primitives are actually the same primitive shifted in space. Other formed patterns can be generated using selected shapes from a shape library. The desired pattern is analyzed to determine the smallest set of generalized shapes stored in the library which can be used to represent the pattern. Integrating the exposures necessary for each shape yields the desired pattern.

Individual shapes can be rotated or translated as required by determining the phase and amplitude changes equivalent to the corresponding displacement of the wafer 20 relative to the beams for each of the projection primitives used to create the shape. Translation of a projection primitive can be accomplished by adjusting the phases of the beams according to the beam's coordinates with respect to the desired axis of translation. The result is conceptually equivalent to that achieved by tilting the projector as a unit relative to the wafer 20.

A circular arrangement of beams can provide advantages including, for example, a large depth of field which exists throughout the region of overlap. This depth of field is large in comparison to that achievable with convention imaging with lens systems. In addition, the projection primitive can be easily rotated multiples (n) of 360/n degrees, where n is the number of beams and the beams are arranged with rotational symmetry. In such a case, the phase and amplitude of each beam is simply assigned to the phase and amplitude of the correct beam ahead of or before it, depending upon whether the rotation is clockwise or counterclockwise. Integrating the exposures necessary for each shape yields the desired pattern.

In some instances there may be no satisfactory combination of projection primitives in the library for a particular shape and, therefore, determination of a new set of exposures corresponding to one or more new projection primitives is required. Under these circumstances a penalty/reward function (PR function) based on the desired pattern is utilized. The PR function is designed to calculate a figure of merit indicating how well a particular combination of phase and amplitude values represents the desired pattern. The function is positively influenced for energy predicted to lie within the desired shape. The function, however, imparts a disproportionately greater negative influence on the figure of merit for exposure dose predicted to lie outside the desired shape. For example, the function can integrate dose over the desired shape area and multiply the result by a small positive value to generate a positive product. This function then integrates dose over a bounded area (e.g., a portion of the wafer surface area) that surrounds the desired shape area and multiplies the result by a large negative value to generate a negative product. The figure of merit is the sum of the negative and positive products. The unbalanced sensitivity of this function is due to the ability to add exposure dose when insufficient exposure results inside the desired shape and the inability to remove unwanted exposure dose for regions outside the desired shape. An initial guess of amplitude and phase values for the beams is made and the figure of merit is calculated. At least one amplitude or phase value is then changed and a new figure of merit is calculated. This process is iterated in a controlled manner so that sensitivities to amplitude and phase values can be utilized and an optimum is determined. Most lithographic patterns are made up of a small set of shapes such as rectangles, circles, donuts, dots, dot combinations and rectangle combinations. Once these shapes are optimized, it would not generally be necessary to compute new projection primitives.

Figure 4:
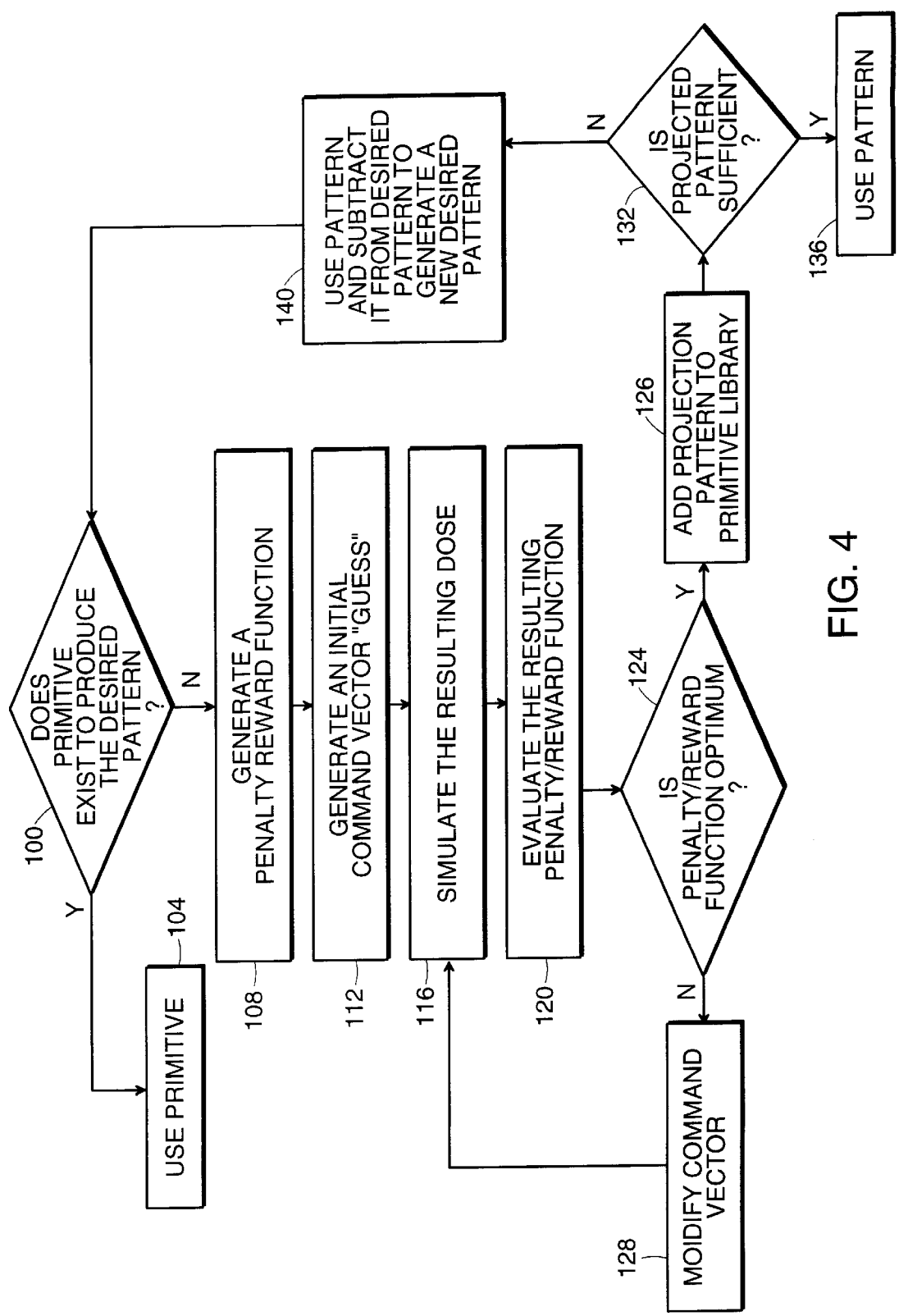
FIG. 4 is a flowchart depicting the steps required in one embodiment of the invention to generate a projection primitive.

In more detail, FIG. 4 depicts a flowchart of an embodiment of a method for generating an unknown projection primitive. First a library of projection primitives is searched to determine if an acceptable projection primitive exists (step 100), and if one is found, it is used (step 104). If one is not found a penalty/reward function is generated (step 108) having the characteristics discussed above. An initial guess is made for the command vector, a set of amplitudes and phases for the optical beams used in the projection beams, which will cause the penalty reward function to reach an extreme (step 112). The extreme is either a maximum or minimum, depending on whether the penalty/reward function is constructed so as to minimize or maximize upon finding the optimum vector. Using this command vector a dose simulation is performed (step 116), the penalty/reward function is evaluated (step 120) and a determination is made as to whether it is an optimum (step 124).

The determination of local extreme in one embodiment is accomplished using a hill climbing algorithm. According to this algorithm if the command vector does not result in a local extreme, then the command vector is modified (step 128) and the process is repeated (step 116). To modify the command vector initially a new vector is simply selected, for example a set of random numbers, and evaluated. However, once a number of penalty/reward function evaluations have occurred, an informed guess can be made by looking at the gradient of the penalty/reward function as a function of the various parameters. One way of forming such an informed guess command vector is using a Nelder-Mead simplex search method. The best local extreme is then used to form the desired projection primitive and its sufficiency evaluated (step 132). If the primitive is sufficient it is used (step 136) and, if not, the calculated projection primitive is subtracted from the desired projection primitive to provide a new desired pattern (step 140), and the process is repeated (step 100).

FIGS. 5*a* and 5*b* depict a contour intensity plot for two primitives which when combined form a rectangle as shown in the contour intensity plot in FIG. 5*c*. In use, a wafer is exposed to the first primitive (FIG. 5*a*) and then subsequently exposed to the second primitive (FIG. 5*b*). The chemical photoresist 24 integrates the intensity from the two images which results in the rectangle shown in FIG. 5*c*. FIGS. 6*a* and 6*b* list the intensity (amplitude) and phase for each of the fifteen beams used to create the primitives shown in FIGS. 5*a* and 5*b*, respectively.

Because an interference pattern generated by the numerous sources may have a spatial extent beyond the actual portion of the pattern of interest, it is occasionally necessary to remove the unwanted portion of the pattern. Referring again to FIG. 1, in one embodiment one mechanism for limiting the spatial extent of the interference pattern is to place an aperture 44 (shown in phantom as a hole 44 in a plate 40) in the beam path to physically limit the extent of the interference pattern at the wafer surface.

Figure 7:
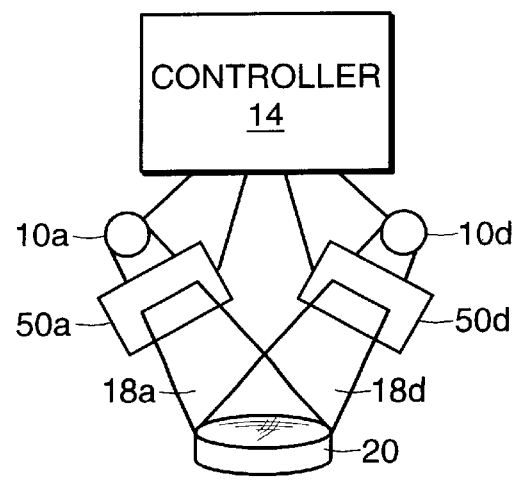
FIG. 7 is a highly schematic diagram of an embodiment of the system of the invention utilizing acoustic-optical modulators for modifying the phase of the optical radiation.

In the embodiment shown in FIG. 1 the sources 10 are each controlled directly by controller 14 to achieve the desired intensity and phase of each beam 18. In an alternative embodiment shown in FIG. 7 the phase and intensity of each of the beams 18 is determined by the controller 14. The phase and intensity are changed by a modulator 50 a and d such as an acoustic-optical modulator placed in the path of each beam 18 between the source 10 and the wafer 20 according to parameters set by the controller 14. The embodiments shown in FIG. 1 and FIG. 7 can be part of a system which provides for rotation and translation of the wafer 20. In addition, groups of sources 10 and modulators 50 can be utilized. The fields of view of the groups can be appended to generate large patterns.

Figure 8:
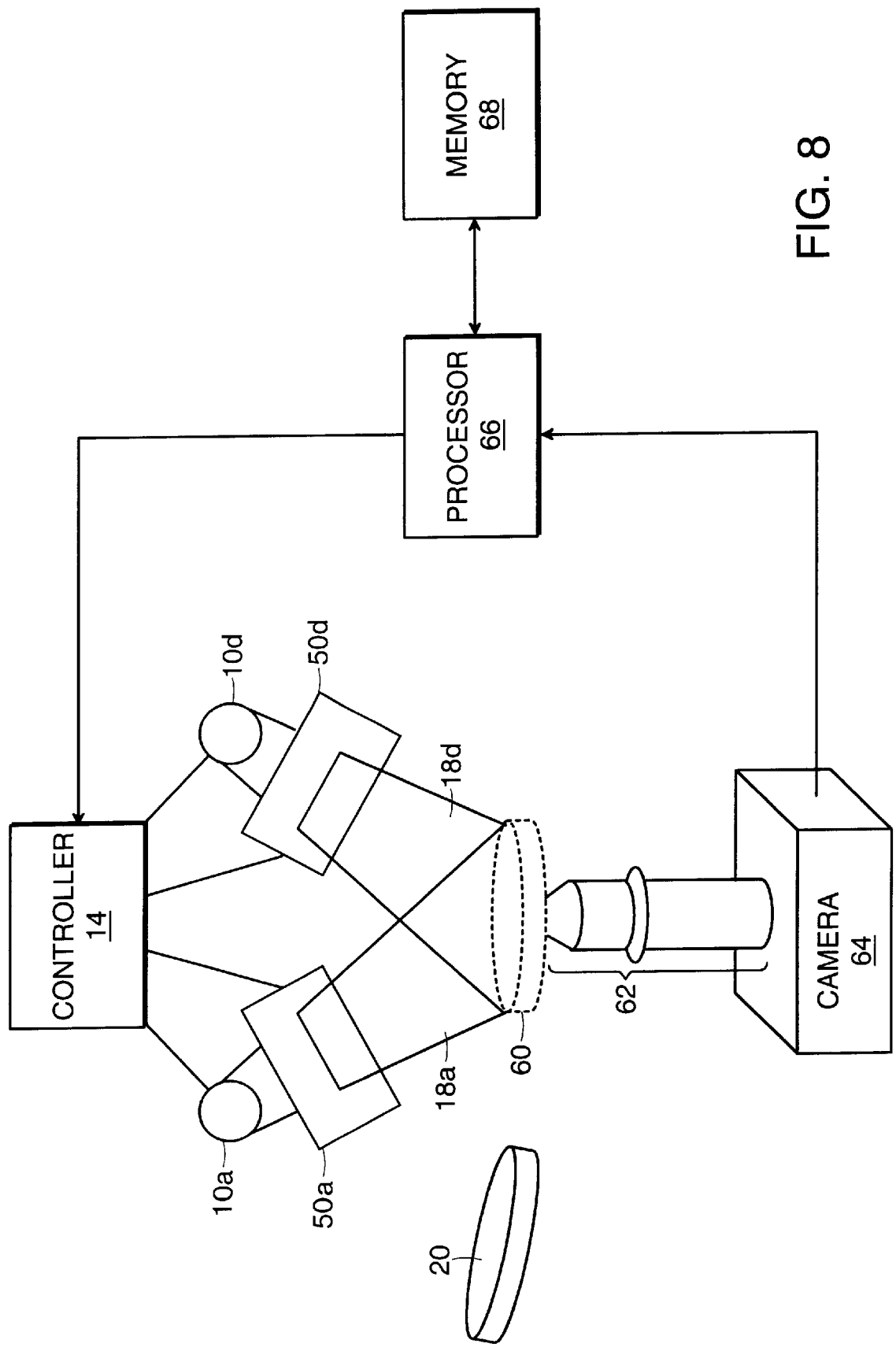
FIG. 8 is a schematic diagram of an embodiment of the system using a calibration device.

Due to mechanical limitations and the high sensitivity of the exposure pattern to the relative phases of the beams, calibration of the synthetic aperture lithographic system is generally required. In the embodiment shown in FIG. 8 a feed-forward control configuration for calibration is shown. During calibration the wafer 20 is removed from its normal exposed position 60 (shown in phantom) and a microscope objective 62 images a portion of the interference pattern onto a CCD camera for a specific set of control parameters. Multiple interference patterns can be used. For example, each calibration pattern can be an interference pattern generated by a single beam pair. A processor 66 and associated memory module 68 are used to analyze the generated calibration patterns based on the known system response and compensate for the phase and/or amplitude offsets in future projections. Alternatively, a feedback configuration can be used for applications when the system is not sufficiently stable for the feedforward calibration. A sensing system for continuously observing the relative phases and/or amplitudes of the beams during projection can be used to correct for variations as they occur.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An interferometric microlithography system for producing a spatially non-periodic pattern comprising:
a source of coherent electromagnetic radiation producing a plurality of coherent electromagnetic beams;
a plurality of beam controllers, each of said beam controllers positioned to receive a respective one of said plurality of said coherent electromagnetic beams and direct said respective coherent electromagnetic beam into a region of overlap defined by an intersection of all of said plurality coherent electromagnetic beams; and
a system controller in electrical communication with each of said plurality of said beam controllers,
wherein each beam controller controls at least one of the phase, amplitude and polarization of a respective one of said plurality of coherent electromagnetic beams in response to control signals from said system controller, and
wherein said spatially non-periodic pattern is formed within said region of overlap by the interference of said plurality of coherent electromagnetic beams in response to said control signals from said system controller.

2. The system of claim 1 further comprising a source controller in electrical communication with said system controller and said source of coherent electromagnetic radiation wherein said source controller controls the amplitude of each of said plurality of coherent electromagnetic beams as a function of time in response to said control signals from said system controller.

3. The system of claim 1 wherein said source of coherent electromagnetic radiation comprises:
a laser producing a coherent electromagnetic beam; and
a beam splitter device positioned to receive said coherent electromagnetic beam and produce said plurality of coherent electromagnetic beams therefrom.

4. The system of claim 1 wherein one of said beam controllers comprises an acousto-optic device.

5. The system of claim 4 wherein one of said beam controllers comprises an acousto-optic modulator.

6. The system of claim 1 further comprising a field stop adjacent to said region of overlap wherein said field stop limits a spatial extent of said spatially non-periodic pattern.

7. The system of claim 1 further comprising an apodizing element for at least one of said plurality of coherent electromagnetic beams wherein said apodizing element limits a spatial extent of the at least one coherent electromagnetic beam.

8. The system of claim 1 further comprising a receiver to receive said spatially non-periodic pattern.

9. The system of claim 8 wherein said receiver comprises a photosensitive surface.

10. The system of claim 8 wherein said receiver receives a plurality of said spatially non-periodic patterns.

11. A method for producing a spatially non-periodic pattern comprising the steps of:

provoding a plurality of coherent electromagnetic beams;

directing said plurality of coherent electromagnetic beams into a region of overlap defined by an intersection of all of said plurality coherent electromagnetic beams; and modulating at least one of the phase, amplitude and polarization of at least one of said plurality of coherent electromagnetic beam to thereby form aids spatially non-periodic pattern in said region of overlap by the interference of said plurality of coherent electromagnetic beams.

12. The method of claim 11 wherein the step of modulating at least one of the phase, amplitude and polarization of said at least one of said plurality of coherent electromagnetic beams comprises the steps of:

providing an acousto-optic modulator; and modulating said coherent electromagnetic beam using said acousto-optic modulator.

13. The method of claim 11 wherein said step of providing said plurality of electromagnetic beams comprises the steps of:

providing a source of a coherent electromagnetic beam; and splitting said coherent electromagnetic beam into a plurality of coherent electromagnetic beams.

14. The method of claim 11 further comprising the steps of:

providing a substrate;

providing a layer of photoresist at said substrate; and exposing said photoresist to said spatially non-periodic pattern.

15. The method of claim 14 further comprising repeating said steps of modulating and exposing to generate a predetermined pattern in said layer of photoresist.

16. The method of claim 11 further comprising the step of calibrating said interference prior to forming said spatially non-periodic pattern.

17. The method of claim 11 further comprising the step of calibrating said interference during generation of said spatially non-periodic pattern.

18. The method of claim 11 further comprising the step of apodizing said spatially non-periodic pattern.

19. An interferometric microlithography system for producing a spatially non-periodic pattern comprising:

a source of coherent electromagnetic radiation producing a coherent electromagnetic beam;

a beam controller positioned to receive said coherent electromagnetic beam and generate a plurality of coherent output beams; and a system controller in electrical communication with said beam controller, wherein said beam controller controls at least one of the phase, amplitude and polarization of at least one of said coherent output beams in response to control signals from said system controller, and wherein said spatially non-periodic pattern is formed within said region of overlap by the interference of said plurality of coherent output beams in response to said control signals from said controller.

20. The system of claim 19 wherein said beam controller further comprises a source controller in electrical communication with said source of coherent electromagnetic radiation, said source controller controlling the amplitude of said coherent electromagnetic beam produced by said source as a function of time in response to control signals from said system controller.

21. The system of claim 19 further comprising at least one beam director positioned to receive a respective one of said plurality of coherent output beams and direct said respective coherent output beam into said region of overlap.

22. The system of claim 8 wherein said receiver comprises a photosensitive volume.

* * * * *

UNITED STATES PATENT AND TRADEMARK OFFICE
CERTIFICATE OF CORRECTION

PATENT NO. : 6,140,660
DATED : October 31, 2000
INVENTOR(S) : Mermelstein

Page 1 of 1

It is certified that error appears in the above-identified patent and that said Letters Patent is hereby corrected as shown below:

Column 7,
Line 13, claim 11, delete [beam], insert --beams--;

Column 7,
Line 13, claim 11, delete [aids], insert --said--:

Signed and Sealed this

Twelfth Day of June, 2001

*Attest:*

*Nicholas P. Godici*

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO. : 6,140,660
DATED : October 31, 2000
INVENTOR(S) : Mermelstein

It is certified that error appears in the above-identified patent and that said Letters Patent is hereby corrected as shown below:

<u>Column 7</u>,
Line 13, claim 11, delete [beam], insert --beams--;
Line 13, claim 11, delete [aids], insert --said--:

Signed and Sealed this

Twenty-sixth Day of June, 2001

*Attest:*

*Attesting Officer*

NICHOLAS P. GODICI
*Acting Director of the United States Patent and Trademark Office*